(12) United States Patent
Cohen

(10) Patent No.: US 8,468,296 B1
(45) Date of Patent: Jun. 18, 2013

(54) METHOD AND APPARATUS FOR RANGE ENCODING IN TCAM

(75) Inventor: Rami Cohen, Haifa (IL)

(73) Assignee: Marvell Israel (M.I.S.L.) Ltd., Yokneam (IL)

( * ) Notice: Subject to any disclaimer, the term of this patent is extended or adjusted under 35 U.S.C. 154(b) by 437 days.

(21) Appl. No.: 12/714,788

(22) Filed: Mar. 1, 2010

Related U.S. Application Data

(60) Provisional application No. 61/156,659, filed on Mar. 2, 2009.

(51) Int. Cl.
*G06F 12/00* (2006.01)

(52) U.S. Cl.
USPC ........... 711/108; 711/100; 711/106; 711/154; 365/49.1; 365/49.16; 365/49.18

(58) Field of Classification Search
USPC .......... 711/106, 108, 154, E12.001, E12.017, 711/E12.018; 365/49, 49.1, 49.16, 49.18
See application file for complete search history.

(56) References Cited

U.S. PATENT DOCUMENTS

| | | | |
|---|---|---|---|
| 7,711,893 B1 * | 5/2010 | Venkatachary | 711/108 |
| 7,814,266 B1 * | 10/2010 | Maheshwari | 711/108 |
| 7,894,227 B2 * | 2/2011 | Inoue | 365/49.17 |
| 2006/0262583 A1 * | 11/2006 | Venkatachary | 365/49 |
| 2009/0310504 A1 * | 12/2009 | Engbersen et al. | 370/252 |

* cited by examiner

*Primary Examiner* — Tuan Thai
*Assistant Examiner* — Zhuo Li

(57) ABSTRACT

Aspects of the disclosure provide a method for encoding ranges in a ternary content addressable memory (TCAM). The method includes determining first positive ranges and first negative ranges corresponding to a first encoding range to be encoded in the TCAM. The first encoding range is in association with a first action. The first positive ranges include the first encoding range. The first negative ranges exclude the first encoding range. At least a first positive range and a first negative range are overlapping. Further, the method includes encoding the first positive ranges in first TCAM entries, and encoding the first negative ranges in second TCAM entries. At least one of the second TCAM entries has a higher priority than one of the first TCAM entries. Then, the method includes associating the first TCAM entries to the first action, and associating the second TCAM entries to a reject action.

20 Claims, 13 Drawing Sheets

| ENTRY ADDRESS | ENTRY DATA | ACTION |
|---|---|---|
| i | 0 0 0 0 0 | REJECT |
| i + 1 | 0 0 X X X | ACCEPT |
| i + 2 | 0 1 0 X X | ACCEPT |
| i + 3 | 0 1 1 0 X | ACCEPT |
| i + 4 | 0 1 1 1 0 | ACCEPT |
| i + 5 | 0 1 1 1 1 | ACCEPT |
| i + 6 | 1 0 0 0 0 | ACCEPT |
| i + 7 | 1 0 0 0 0 | REJECT |
| i + 8 | 1 1 1 1 1 | REJECT |
| i + 9 | 1 X X X X | ACCEPT |
| ⋮ | ⋮ | ⋮ |
| n | X X X X X | REJECT |

| ENTRY ADDRESS | ENTRY DATA | ACTION |
|---|---|---|
| i | 0 0 0 0 0 | REJECT |
| i + 1 | 0 1 1 1 1 | ACCEPT |
| i + 2 | 0 X X X X | ACCEPT |
| i + 3 | 1 0 0 0 0 | ACCEPT |
| i + 4 | 1 1 1 1 1 | REJECT |
| i + 5 | 1 X X X X | ACCEPT |
| ⋮ | ⋮ | ⋮ |
| n | X X X X X | REJECT |

Code Example
(written in Ansi C)

```c
#define INT_LENGTH   (sizeof(int)*8)

char *action[]={
  "Accept",
  "Reject"
};

void dec2bin(int n)
{
  int b;
  if(n==0){
    printf("0");
    return;
  }
  b=n%2;
  dec2bin(n/2);
  printf("%d", b);
  return;
} void printbin(int n)
{
  dec2bin(n);
  printf("\n");
} int power2(int x)
{
  int y=1, i;
  for(i=0; i<x, i++)
    y*=2;
  return y;
} int getT(int x, int y)
{
  int mask;
  int m;
  if(x==y) return -1;
  m=INT_LENGTH-1;
  mask=1<<m;
  while((x&mask) == (y&mask)){
    m--;
    mask=1<<m;
  }
  return m+1;
}
```

FIG. 8A

```
int printPrefix(int k, int t, int w)
{
  int i;

for(i=w-1; i>=t; i--)
    printf("%d", (k>>i)&1);
  for(; i>=0; i--)
    printf("*");
  return 0;
} int encodingRange(int x, int y, int w, int act)
{
  int t, k;
  int first, last, mid;
  int e1, e2, e3, e4, e5;
  int min;

t=getT(x, y);
  k= ~(power2(t)-1);
  k = k&x;

first = k;
  last = k+power2(t)-1;
  mid= k+power2(t-1);

if(x==y){
    if(w>0){
      printPrefix(x, 0, w);
      printf("\t %s\n", action[act]);
    }
    return 1;
  } if(x==first && y==last){
    if(w>0){
      printPrefix(k, t, w);
      printf("\t %s\n", action[act]);
    }
    return 1;
  }
  if(x>y){
    return 0;
  }
```

FIG. 8B

```
e1 = encodingRange(first, x-1, 0, -1) + encodingRange(y+1, last, 0, -1)
+encodingRange(first, last, 0, -1);
min=1;

if(x>first){
  e2 = encodingRange(first, x-1, 0, -1) + encodingRange(first, y, 0, -1);
  if(e2<e1){
    min=2;
    e1=e2;
  }
} if(y<last){
  e3 = encodingRange(x, last, 0, -1) + encodingRange(y+1, last, 0, -1);
  if(e3<e1){
    min=3;
    e1=e3;
  }
}
```

FIG. 8C

```
e4 = encodingRange(x, mid-1, 0, -1) + encodingRange(mid, y, 0, -1);
if(e4<e1){
  min=4;
  e1=e4;
}
if(w==0) return e1;

switch(min){
case 1:
  encodingRange(first, x-1, w, 1-act);
  encodingRange(y+1, last, w, 1-act);
  encodingRange(first, last, w, act);
  break;
case 2:
  encodingRange(first, x-1, w, 1-act);
  encodingRange(first, y, w, act);
  break;
case 3:
  encodingRange(y+1, last, w, 1-act);
  encodingRange(x, last, w, act);
  break;
case 4:
  encodingRange(x, mid-1, w, act);
  encodingRange(mid, y, w, act);
  break;
} return e1;
}
```

FIG. 8D

METHOD AND APPARATUS FOR RANGE ENCODING IN TCAM

INCORPORATION BY REFERENCE

This application claims the benefit of U.S. Provisional Application No. 61/156,659, "Optimized Encoding for Range Classification Using TCAM" filed on Mar. 2, 2009, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Ternary content addressable memory (TCAM) stores data using ternary states. In an example, the ternary states are configured to correspond to logic "0", logic "1", and mask "X". The ternary states can be used to encode ranges in the stored data. For example, a range [0,3] is encoded and stored as "XX" in the TCAM.

SUMMARY

Aspects of the disclosure can provide a method for encoding ranges in a ternary content addressable memory (TCAM). The method includes determining first positive ranges and first negative ranges corresponding to a first encoding range to be encoded in the TCAM. The first encoding range is in association with a first action. The first positive ranges include the first encoding range. The first negative ranges exclude the first encoding range. At least a first positive range and a first negative range are overlapping. Further, the method includes encoding the first positive ranges in first TCAM entries, and encoding the first negative ranges in second TCAM entries. At least one of the second TCAM entries has a higher priority than one of the first TCAM entries. Then, the method includes associating the first TCAM entries to the first action, and associating the second TCAM entries to different actions from the first action, such as a reject action.

The first encoding range includes a first boundary and a second boundary. The first boundary is lower than the second boundary. In an embodiment, the first positive ranges and the first negative ranges overlap below a first boundary of the first encoding range. In another embodiment, the first positive ranges and the first negative ranges overlap above the second boundary of the first encoding range.

In an embodiment, the method includes determining that a first number of the first TCAM entries and the second TCAM entries is smaller than a second number of TCAM entries using a non-overlapping encoding technique to encode the first encoding range.

Further, the method includes encoding a second encoding range in the TCAM. The second encoding range is in association with a second action.

In an embodiment, when the second coding range is lower than the first encoding range, the first encoding range can be encoded without restriction. When the second encoding range is higher than the first encoding range, however the first negative ranges do not overlap with the second encoding range, the first encoding range can be encoded without restriction.

In another embodiment, when an entry of the second TCAM entries storing a negative range that overlaps with the second encoding range, the method includes re-associating the entry with the second action.

Aspects of the disclosure can provide a ternary content addressable memory (TCAM). The TCAM includes first TCAM entries for encoding a first encoding range in association with a first action. The first TCAM entries include a first plurality of TCAM entries in association with the first action and a second plurality of TCAM entries in association with different actions from the first action, such as a reject action. The first plurality of TCAM entries store first positive ranges and the first positive ranges include the first encoding range. The second plurality of TCAM entries store first negative ranges, and the first negative ranges exclude the first encoding range. At least a first negative range overlaps a first positive range. A TCAM entry of the second plurality of TCAM entries that stores the first negative range of the two overlapping ranges has a higher priority than a TCAM entry of the first plurality of TCAM entries that stores the first positive range.

The first encoding range includes a first boundary and a second boundary. The first boundary is lower than the second boundary. In an embodiment, the first positive ranges and the first negative ranges overlap below the first boundary of the first encoding range. In another embodiment, the first positive ranges and the first negative ranges overlap above the second boundary of the first encoding range.

Further, the TCAM includes second TCAM entries for encoding a second encoding range, the second encoding range is associated with a second action. In an embodiment, the second encoding range is lower than the first encoding range. In another embodiment, the second encoding range is higher than the first encoding range, and the first negative ranges do not overlap with the second encoding range. In another embodiment, a first negative range is within the second encoding range. An entry storing the first negative range is in association with the second action.

Aspects of the disclosure also provide a network switch that includes the TCAM module to store range conditions of switching rules.

Aspects of the disclosure also provide a computer readable medium storing program instructions for causing a processor to execute operations for encoding ranges in a ternary content addressable memory (TCAM).

BRIEF DESCRIPTION OF THE DRAWINGS

Various embodiments of this disclosure that are proposed as examples will be described in detail with reference to the following figures, wherein like numerals reference like elements, and wherein:

FIGS. 8A-8D show a code example for encoding ranges in a TCAM according to an embodiment of the disclosure.

DETAILED DESCRIPTION OF EMBODIMENTS

Figure 1:
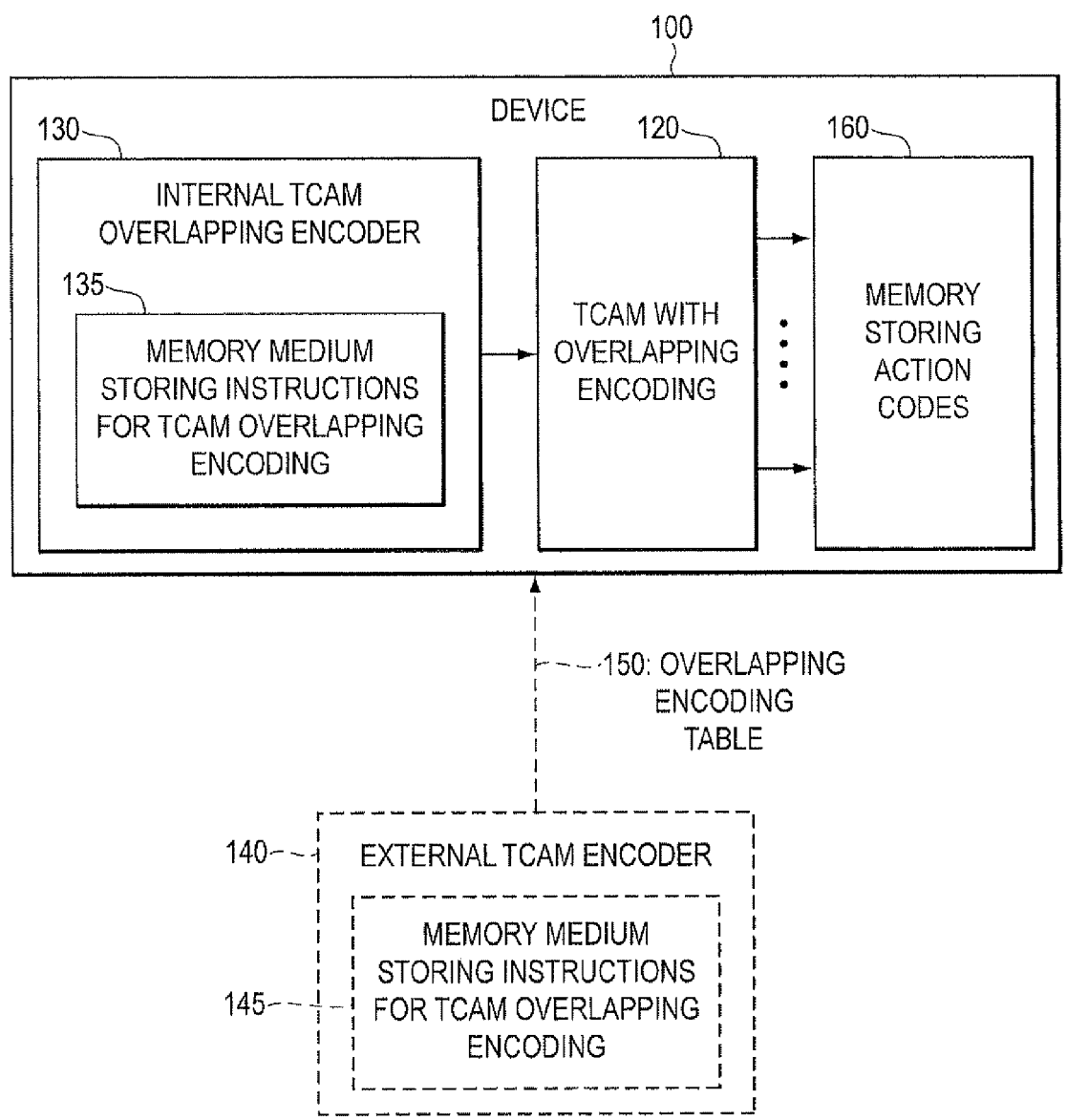
FIG. 1 shows a block diagram of a device example according to an embodiment of the disclosure.

FIG. 1 shows a block diagram of a device example 100 according to an embodiment of the disclosure. The device 100 includes a ternary content addressable memory (TCAM) module 120, a TCAM encoder module 130, and a memory module 160. The TCAM module 120 stores ranges according to overlapping encoding, and searches an address that stores matching data to a search key. The TCAM encoder module 130 determines the overlapping encoding to store the ranges, and controls the TCAM module 120 to store accordingly. The memory module 160 stores action codes. These elements are coupled together as shown in FIG. 1.

In an embodiment, the device 100 is a switching device for packet switching based on switching rules. Each switching rule includes criteria and an action. In an example, a switching rule is expressed in plain English as "permit forwarding a packet with source address 172.15.5.236, TCP port number between 1 to 14". The switching rule includes a source address criterion, a TCP port number criterion, and an action "permit forwarding" in association with the criteria. When a received packet satisfies the criteria, the action can be taken on the received packet. The TCAM module 120 stores the criteria of the switching rule. The memory module 160 stores codes of the action. In addition, the TCAM module 120 determines whether the received packet satisfies the criteria, and points to the action codes in the memory module 160 when the received packet satisfies the criteria. The TCAM encoder module 130 determines how to encode the criteria into the TCAM module 120.

The TCAM module 120 includes one or more TCAM banks. A TCAM bank includes an array of storage elements arranged in rows and columns. Each storage element has ternary states for storing a ternary bit, such as logic "0", logic "1" or mask "X". Further, the storage element can be compared to a binary bit (logic "0" or logic "1") to determine a match or non-match. In an embodiment, mask "X" matches both logic "0" and logic "1".

The storage elements are suitably coupled to form storage entries. In an example, storage elements in a row are coupled to a match line to form a storage entry. The match line is configured to indicate a match status of the storage entry to a search key of binary bits. In an example, the match line is pre-charged to a relatively high voltage. When a storage element in the storage entry does not match a corresponding bit in the search key, a discharging path is turned on to pull down the match line voltage. However, when all the storage elements in the storage entry match their corresponding bits in the search key, the match line voltage stays at the relatively high voltage indicating a matching storage entry. It is noted that more than one storage entries can match the same search key.

The storage entries are addressed, and prioritized. In an example, a TCAM bank includes 256 storage entries that are addressed by 8-bit. The 256 storage entries are also prioritized based on their addresses. In an example, the storage entry with a relatively lower address has a relatively higher priority. When multiple storage entries match a same search key, the storage entry with the highest priority is the hitting storage entry of the TCAM bank. Generally, the TCAM bank includes a priority encoder (not shown) that priorities the address of the hitting storage entry. The address is used to determine a location of the memory module 160 that stores action codes to be taken.

Ranges are encoded and stored in the storage entries. In an example, a range [0,1] is encoded and stored in a 5-bit field by "0000X", and a range [8,11] is encoded and stored in the 5-bit field by "010XX". Some ranges are encoded and stored in multiple storage entries. In an example, a range [4,11] is encoded and stored in two storage entries by "001XX" and "010XX".

According to an embodiment of the disclosure, the TCAM module 120 stores a range using overlapping encoding. In an example, a range [0,14] is encoded by "0XXXX" ([0,15]) and "01111" ([15,15]). It is noted that the "0XXXX" and "01111" include an overlapping portion [15,15]. "0XXXX" is stored in a first storage entry, and "01111" is stored in a second storage entry in a TCAM bank. The first storage entry has a lower priority than the second storage entry. Thus, when a search key falls in the overlapping portion of the first storage entry and the second storage entry, the second storage entry is prioritized as the matching entry. In an example, the first storage entry has a higher address than the second storage entry. The address of the first storage entry directs to a first action to be taken. In an example, the address of the first storage entry points to a first location in the memory module 160 storing first action codes of the first action.

The TCAM module 120 can use any suitably technique to correlate the address of the first storage entry with the first location in the memory module 160, such as look-up table, and the like.

Similarly, the address of the second storage entry directs to a second action to be taken. In an example, the address of the second storage entry points to a second location in the memory module 160 storing second action codes of the second action. In another example, the second action is a reject action, such as packet dropping, a default rejection, and the like.

Generally, the TCAM module 120 includes an entry directing to a default action, such as a rejection action, for packets that do not satisfy any switching rules. In an embodiment, a TCAM bank stores all mask bits in a storage entry that has the lowest priority (highest address) of the TCAM bank. Thus, the TCAM bank outputs the highest address of the TCAM bank when other storage entries do not match a search key. The highest address directs to the default rejection.

The TCAM encoder module 130 determines encodings of ranges, and controls the TCAM module 120 to store the ranges accordingly. In an embodiment, the TCAM encoder module 130 uses an overlapping encoding for a range, and controls the TCAM module 120 to store the range according to the overlapping encoding.

In an example, the TCAM encoder module 130 receives criteria along with a pointer. The criteria include a desired range of a parameter, such as sender IP address, TCP port number, and the like. The pointer points to an address location of the memory module 160 storing action codes of a switching action.

The TCAM encoder module 130 encodes the desired range using overlapping encoding. Specifically, the TCAM encoder module 130 encodes the desired range into multiple ranges. Each of the multiple ranges can be stored using one storage entry. In addition, at least two ranges are overlapping ranges. In an example, the first range of the two overlapping ranges includes a first portion in the desired range, and a second portion that is not in the desired range. The second range of the two overlapping ranges corresponds to the second portion that is not in the desired range. Ranges including portions of the desired range are referred as positive ranges. Ranges excluding the desired range are referred as negative ranges. The desired range is encoded using positive ranges and negative ranges.

Further, the TCAM encoder module 130 tags priorities to the multiple ranges. In an embodiment, when a positive range and a negative range overlaps, the TCAM encoder module 130 tags a relatively higher priority to the negative range of the two overlapping ranges, and tags a relatively lower priority to the positive range of the two overlapping ranges. In an example, the TCAM encoder module 130 selects storage entries for storing the multiple ranges. The TCAM encoder module 130 selects a first storage entry with a relatively higher address for the positive range of the two overlapping ranges, and selects a second storage entry with a relatively lower address for the negative range of the two overlapping ranges.

Then, the TCAM encoder module 130 controls the TCAM module 120 to store the multiple ranges according to the storage entry selection. In addition, the TCAM encoder module 130 controls the TCAM module 120 to associate the first storage entry storing the positive range of the two overlapping ranges to the switching action, and the associate the second storage entry storing the negative range of the two overlapping ranges to a different action, such as a reject action. In an example, the TCAM encoder module 130 associates the received pointer with the address of the first storage entry in a look-up table, and associates a pointer to rejection codes with the address of the second storage entry.

In an example, the TCAM encoder module 130 receives a range [0,14] and a pointer directing to action codes. The TCAM encoder module 130 encodes [0,14] into [0,15] and [15,15]. [0,15] and [15,15] are overlapping ranges (both contain the range [15, 15]). [0,15] includes a first portion ([0,14]) in the [0,14], and a second portion ([15,15]) excluded from [0,14]. [0,15] is referred as a positive range. [15,15] is referred as a negative range in this example. The TCAM encoder module 130 selects a first storage entry with a relatively higher address for [0,15], and selects a second storage entry with a relatively lower address for [15,15]. The TCAM encoder module 130 controls the TCAM module 120 to store [0,15] and [15,15] in the first storage entry and the second storage entry. In addition, the address of the first storage entry is associated with the received pointer, and the address of the second storage entry is associated with, for example, a pointer to rejection codes.

In another example, the TCAM encoder module 130 receives a range [1,14] and a pointer directing to action codes. The TCAM encoder module 130 encodes [1,14] into [0,15], [0,0] and [15,15]. [0,15] and [15,15] are overlapping ranges. Similarly, [0,15] and [0,0] are also overlapping ranges. In this example, [0,15] is a positive range. [0,0] and [15,15] are negative ranges. The TCAM encoder module 130 selects a first storage entry with a relatively higher address for [0,15], and selects second storage entries with relatively lower addresses for [15,15] and [0,0]. The TCAM encoder module 130 controls the TCAM module 120 to store [0,15], [0,0] and [15,15] in the first storage entry and the second storage entries. In addition, the address of the first storage entry is associated with the received pointer, and the addresses of the second storage entries are associated with, for example, a pointer to rejection codes.

The TCAM encoder module 130 can be implemented using any suitably technique. In an example, the TCAM encoder module 130 includes a computer readable memory medium 135 storing instructions for TCAM overlapping encoding. The device 100 includes a processor that executes the instructions for TCAM overlapping encoding.

In an embodiment, overlapping encoding is determined by an external encoder, such as an external TCAM encoder 140. The external TCAM encoder 140 determines overlapping encoding for ranges, and provides an overlapping encoding table 150 to the device 100. The overlapping encoding table 150 specifies addresses of storage entries in the TCAM module 120, data to be stored in the storage entries, and actions in association with the addresses. Based on the overlapping encoding table 150, the TCAM module 120 suitably stores the data in the storage entries, and associates the addresses of the storage entries to the actions.

Similarly, the external TCAM encoder module 140 can be implemented using any suitable technique. In an example, the TCAM encoder module 140 includes a computer readable memory medium 145 storing instructions for overlapping encoding. The instructions can be executed by a processor to perform the overlapping encoding.

It is noted that the TCAM encoder module 130 can also include other range encoding techniques, such as pre-fix encoding, and the like. The pre-fix encoding encodes a range into a plurality of non-overlapping ranges. In an embodiment, the TCAM encoder module 130 first determines an encoding technique for a range that occupies a relatively small number of storage entries, and then encodes the range using the determined encoding technique.

Figure 2:
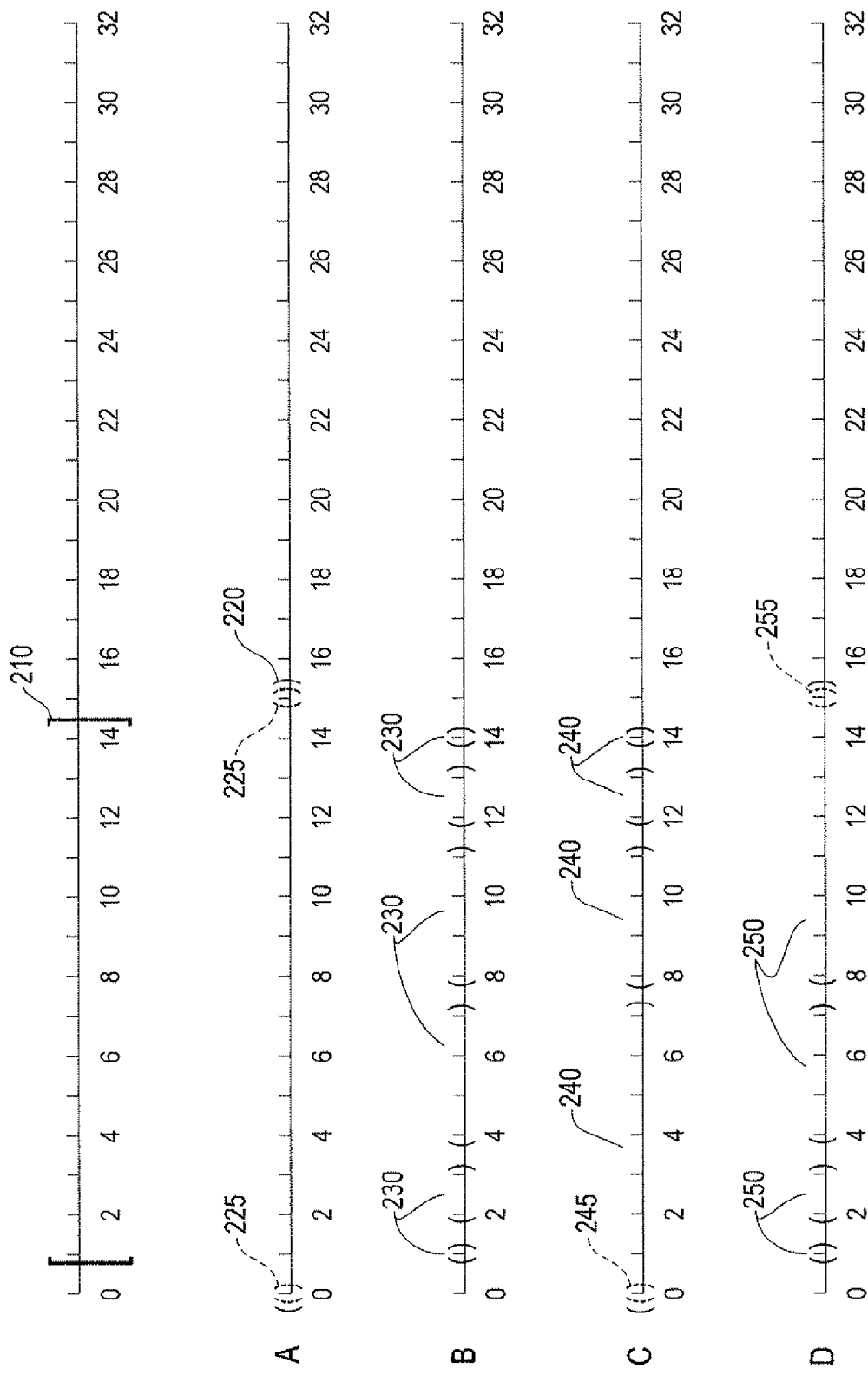
FIG. 2 shows encoding examples according to an embodiment of the disclosure.

FIG. 2 shows encoding examples A-D for an encoding range 210 of [1,14] according to an embodiment of the disclosure.

According to encoding example A, the encoding range 210 is encoded in a positive range 220 of [0,15], and negative ranges 225 of [0,0] and [15,15]. The encoding example A occupies three storage entries. It is noted that the encoding example A uses overlapping encoding. A negative range (an overlapped portion) is below the lower boundary of the encoding range 210. Another negative range (another overlapped portion) is above the upper boundary of the encoding range 210.

According to encoding example B, the encoding range 210 is encoded in positive ranges 230 of [1,1], [2,3], [4,7], [8,11], [12,13], and [14,14]. The encoding example B occupies six storage entries. It is noted that the encoding example B uses a non-overlapping encoding technique.

According to encoding example C, the encoding range 210 is encoded in positive ranges 240 of [0,7], [8,11], [12, 13], and [14,14], and a negative range 245 of [0,0]. The encoding example C occupies five storage entries. It is noted that the encoding example C uses overlapping encoding. The negative range 245 (an overlapped portion) is below the lower boundary of the encoding range 210.

According to encoding example D, the encoding range 210 is encoded in positive ranges 250 of [1,1], [2,3], [4,7] and [8,15], and a negative range 255 of [15, 15]. The encoding example D occupies five storage entries. It is noted that the encoding example D uses overlapping encoding. The negative range 255 (an overlapped portion) is above the upper boundary of the encoding range 210.

Figure 3A:
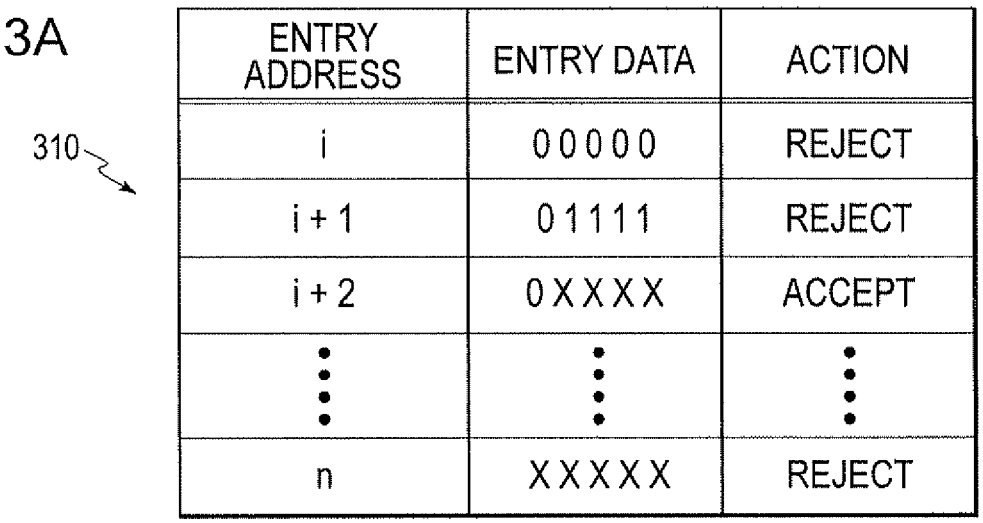
FIGS. 3A-3D show encoding table examples corresponding to the encoding examples in FIG. 2.

FIG. 3A shows an encoding table example 310 corresponding to the encoding example A in FIG. 2.

The encoding table 310 includes an entry address column, an entry data column, and an action column. The entry address column includes addresses of storage entries in a TCAM bank. The entry data column includes data to be stored in the storage entries. The action column includes actions to be associated with the addresses.

In the encoding table 310, storage entries i and i+1 having relatively lower addresses and higher priorities are selected for the negative ranges in the encoding example A, and storage entry i+2 having a relatively higher address and a lower priority is selected for the positive range in the encoding example A. The storage entries i and i+1 are in association with a reject action. The storage entry i+2 is in association with an accept action.

It is noted that the storage entry n having the lowest priority stores all mask bits, and is also in association with the reject action. It is noted that the entry data in the storage entry and i+1 can be swapped without affecting the stored range and the search function.

Figure 3B:
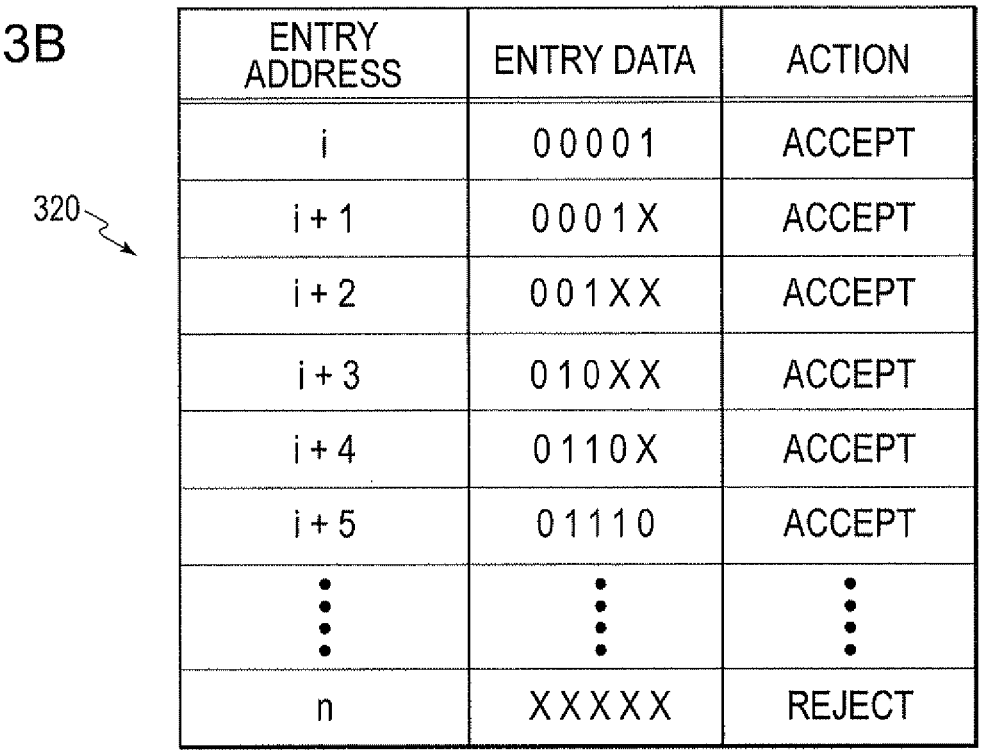

FIG. 3B shows an encoding table example 320 corresponding to the encoding example B in FIG. 2.

Similar to the encoding table 310, the encoding table 320 includes an entry address column, an entry data column, and an action column. The entry address column includes addresses of storage entries in a TCAM bank. The entry data column includes data to be stored in the storage entries. The action column includes actions to be associated with the addresses.

In the encoding table 320, storage entries i to i+5 are selected for the non-overlapping ranges in the encoding example B. The storage entries i to i+5 are in association with the accept action.

It is noted that the storage entry n having the lowest priority stores all mask bits, and is also in association with reject action. It is also noted that the entry data in the storage entry i to i+5 can be swapped without affecting the stored range and the search function.

Figure 3C:
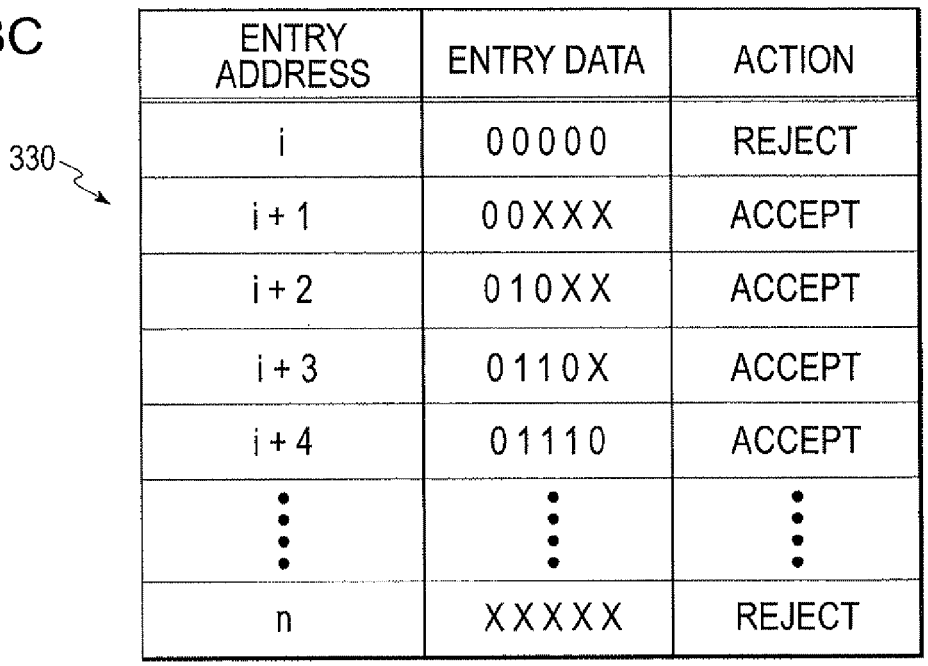

FIG. 3C shows an encoding table example 330 corresponding to the encoding example C in FIG. 2.

The encoding table 330 includes an entry address column, an entry data column, and an action column. The entry address column includes addresses of storage entries in a TCAM bank. The entry data column includes data to be stored in the storage entries. The action column includes actions to be associated with the addresses.

In the encoding table 330, storage entry i having a relatively higher priority is selected for the negative range in the encoding example C, and storage entries i+1 to i+4 having relatively lower priorities are selected for the positive ranges in the encoding example C. The storage entry i is in association with the reject action. The storage entries i+1 to i+4 are in association with the accept action.

It is noted that the storage entry n having the lowest priority stores all mask bits, and is also in association with reject action. It is also noted that storage entry selections can be changed without affecting the stored range, as long as the negative range "00000" is stored in a storage entry having a relatively higher priority than its corresponding overlapping positive range "00XXX".

Figure 3D:
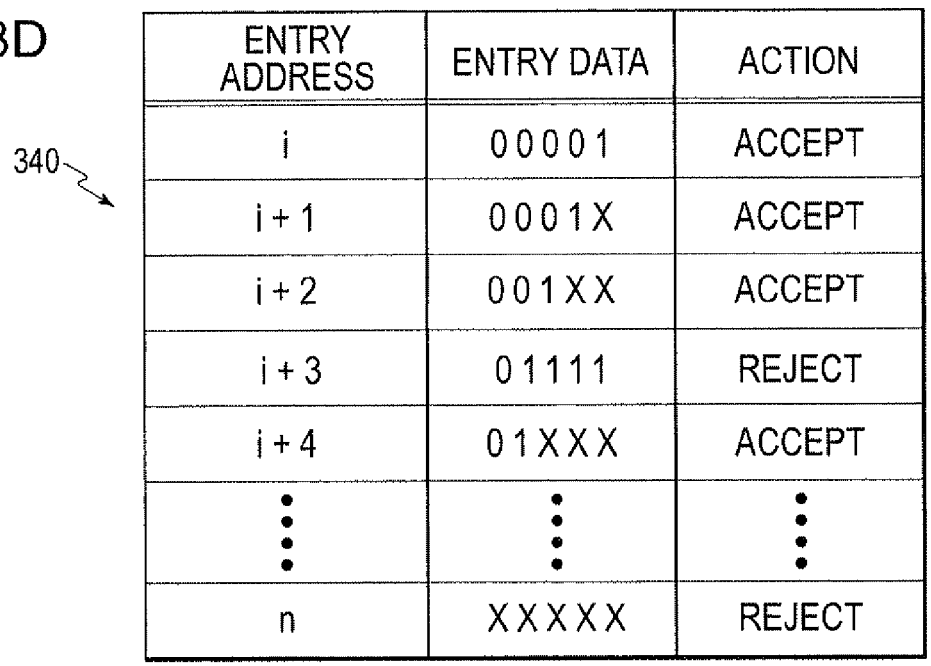

FIG. 3D shows an encoding table example 340 corresponding to the encoding example D in FIG. 2.

The encoding table 340 includes an entry address column, an entry data column, and an action column. The entry address column includes addresses of storage entries in a TCAM bank. The entry data column includes data to be stored in the storage entries. The action column includes actions to be associated with the addresses.

In the encoding table 340, storage entry i+3 having a relatively higher priority is selected for the negative range "01111" in the encoding example D, storage entry i+4 having a relatively lower priority is selected for the corresponding overlapping positive range "01XXX". Storage entries i to i+2 are selected for the non-overlapping positive ranges in the encoding example D. The storage entry i+3 is in association with the reject action. The storage entries i to i+2 and i+4 are in association with the accept action.

It is noted that the storage entry n having the lowest priority stores all mask bits, and is also in association with reject action. It is noted that storage entry selections can be changed without affecting the stored encoding range, as long as the negative range "01111" is stored in a storage entry having a relatively higher priority than its corresponding overlapping positive range "01XXX".

Figure 4:
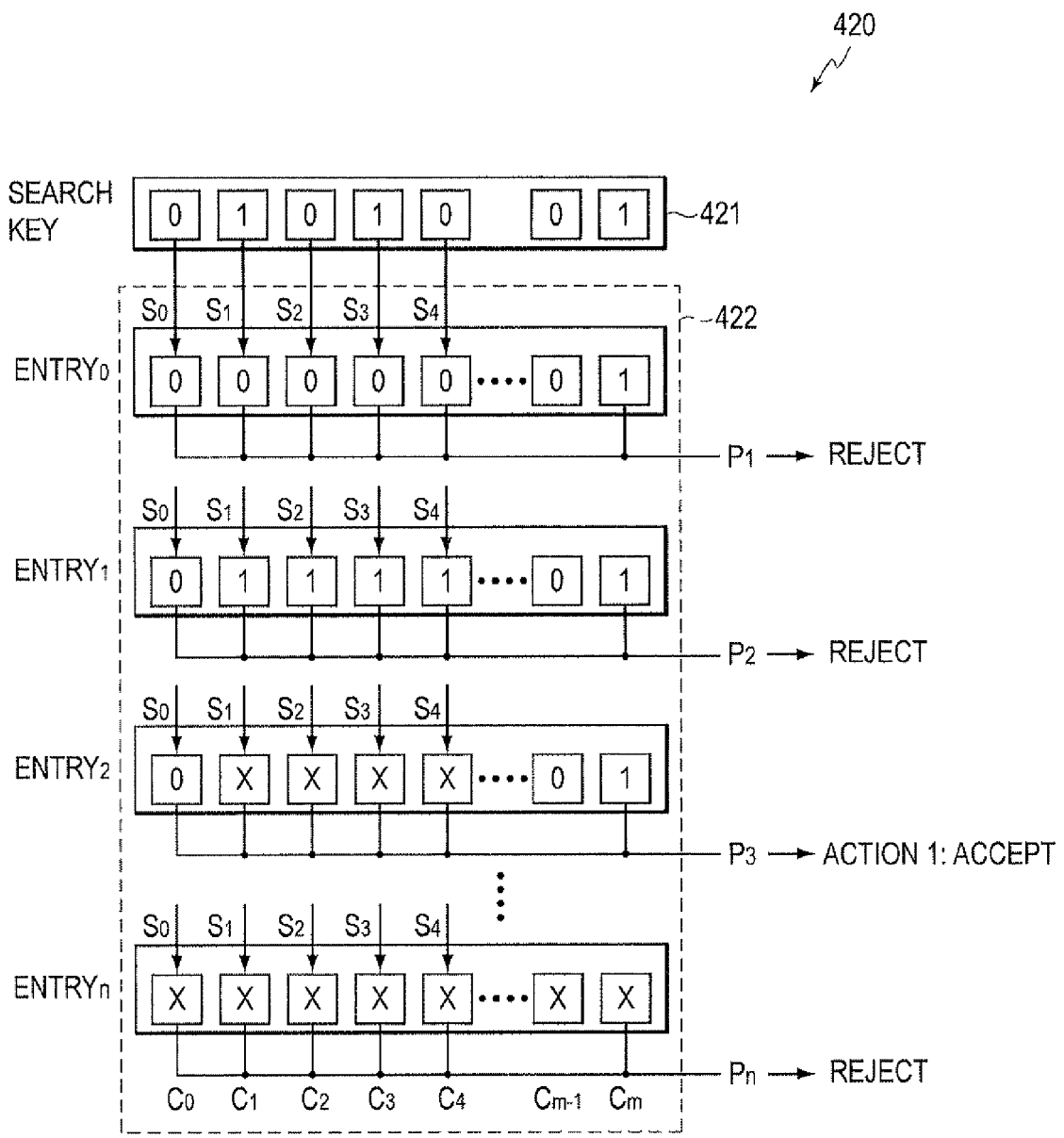
FIG. 4 shows a ternary content addressable memory (TCAM) example according to an embodiment of the disclosure.

FIG. 4 shows a simplified TCAM module example 420 according to an embodiment of the disclosure. Other suitable memory banks are also contemplated. The TCAM module 420 includes a TCAM bank 422. The TCAM bank 422 includes a plurality of storage entries, such as $Entry_0$-$Entry_n$. Each storage entry includes a number of TCAM storage elements, such as $C_0$-$C_m$, coupled to a match line of the storage entry, as shown by $P_1$-$P_n$. Each TCAM storage element can be configured in one of three states to store a ternary bit, such as logic "0", logic "1", or mask "X". In an example, mask "X" means "don't care", therefore the "X" value matches both logic "1" and logic "0". The TCAM storage elements are grouped into fields, such as TCP port field, source address field, destination address field, and the like. In the FIG. 4 example, $C_0$-$C_4$ are grouped together of a 5-bit field to store ranges.

In addition, a search key driving circuit (not shown) drives a search key 421 of binary bits. The search key is compared with the storage entries of the TCAM bank 422 in parallel. Each binary bit of the search key is compared with corresponding ternary bit in each storage entry. When the binary bit of search key and the ternary bit are of the same value, or when the ternary bit is mask "X", the ternary bit matches the binary bit of the search key.

In an embodiment, a storage element includes a first and a second memory cells, such as static random access memory (SRAM) cells, dynamic random access memory (DRAM) cells, and the like. Each of the first and second memory cells is able to store a binary bit. Further, the first and the second memory cells are coupled together, for example, by logic circuits to store the ternary bit. In an example, the ternary bit is stored according to Table 1. Further, the storage element can be compared to a binary bit (logic "0" or logic "1") to determine a match or non-match, as shown in Table 1.

TABLE 1

| First Memory Cell | Second Memory Cell | Ternary Bit | Match |
|---|---|---|---|
| 0 | 0 | Mask | 0 or 1 |
| 0 | 1 | 0 | 0 |
| 1 | 0 | 1 | 1 |
| 1 | 1 | Invalid | No Match |

The match lines $P_1$-$P_n$ are configured to indicate entry matches. In an example, the match lines $P_1$-$P_n$ are pre-charged to a relatively high voltage. When a ternary bit of an entry does not match its corresponding binary bit in the search key, a discharging path to discharge the match line of the entry is turned on, and the match line voltage is pulled down. However, when all the ternary bits in the storage entry match their corresponding binary bits in the search key, the match line voltage is kept relatively high.

In the FIG. 4 example, the TCAM bank 422 stores a range [1,14] according to the encoding table 310. In addition, the storage entries are in association with actions according to the encoding table 310.

Figure 5:
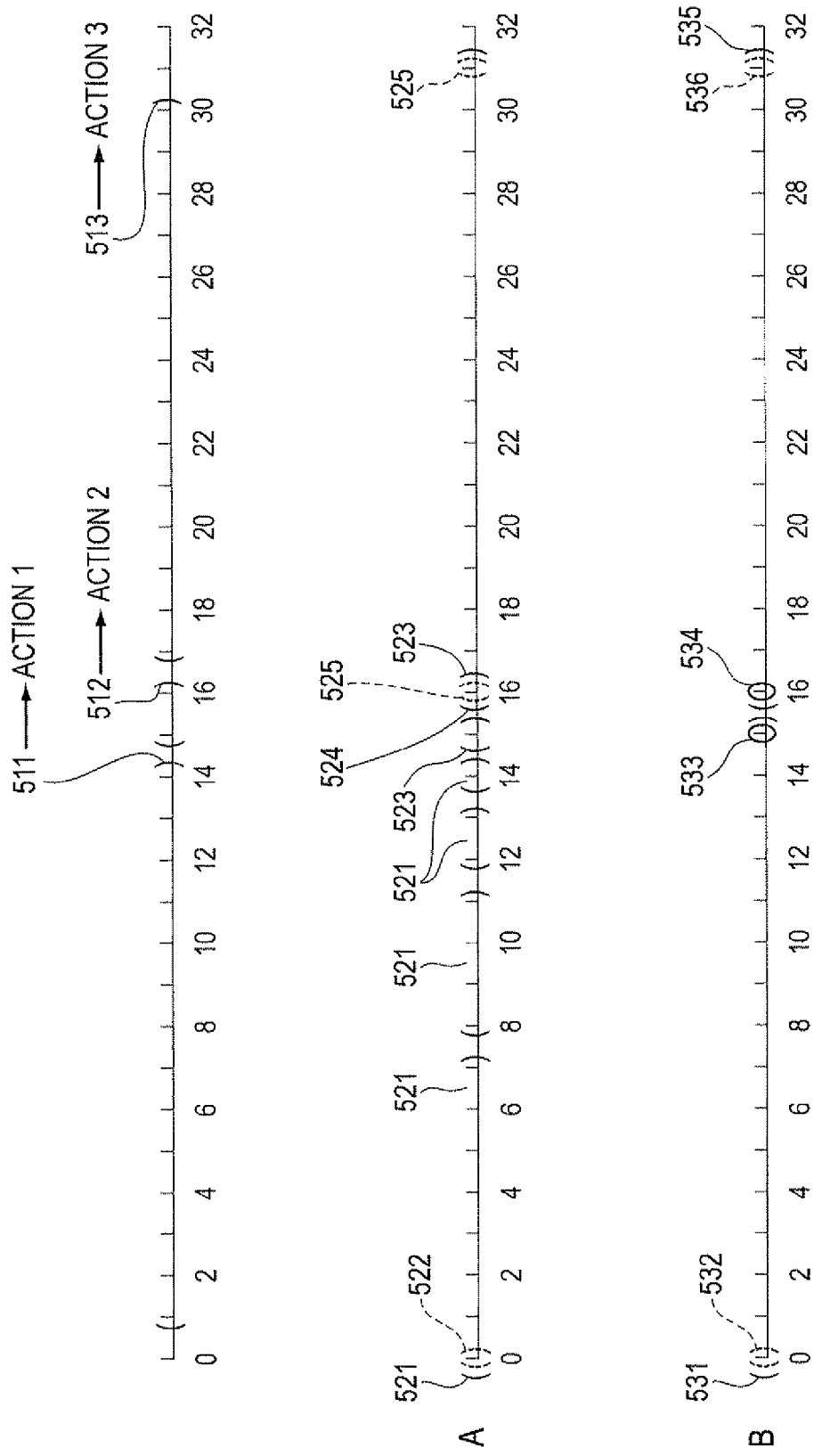
FIG. 5 shows encoding examples according to an embodiment of the disclosure.

FIG. 5 shows encoding examples A-B for multiple encoding ranges 511 of [1,14], 512 of [15,16] and 513 of [17, 30] according to an embodiment of the disclosure.

According to encoding example A in FIG. 5, the encoding range 511 is encoded similarly to the encoding example C in the FIG. 2 by positive ranges 521 and a negative range 522. The encoding range 512 is encoded similarly to the encoding example B in the FIG. 2 by positive ranges 523. The encoding range 513 is encoded similarly to the encoding example A in the FIG. 2 by a positive range 524, and negative ranges 525.

In an embodiment, a TCAM encoder, such as the internal TCAM encoder 130 or the external TCAM encoder 140, sorts the multiple encoding ranges 511, 512 and 513 along a scale, such as shown in FIG. 5. Then, the TCAM encoder determines encoding techniques for the multiple encoding ranges. For example, when a non-overlapping encoding of an encoding range occupies a relatively small number of storage entries, the TCAM encoder determines to use the non-overlapping encoding to encode the encoding range.

When an overlapping encoding of an encoding range occupies a relatively small number of storage entries, the TCAM encoder determines whether using the overlapping encoding affects other encoding ranges. For example, using the encoding example A for the encoding range 511 affects the encoding range 512. However, using the encoding example C for the encoding range 511 does not affect the encoding range 512 or the encoding range 513. In an example, the TCAM encoder is configured to select the overlapping encoding that does not affect other encoding ranges. In another example, when the encoding range is at the most right side of the scale, such as the encoding range 513, the TCAM encoder selects the overlapping encoding without restriction.

According to encoding example B in FIG. 5, the encoding range 512 is encoded similarly to the encoding example B in the FIG. 2, having positive ranges 533 and 534. The encoding range 511 is encoded similar to the encoding example A in the FIG. 2, with a negative range combined into the positive range 533. The encoding range 513 is encoded similarly to the encoding example A in the FIG. 2, with a negative range combined into the positive range 534.

In an example, the TCAM encoder determines an encoding technique for each of the multiple encoding ranges to reduce a number of storage entries for each of the multiple encoding ranges. Further, the TCAM encoder suitably combines the encoded ranges of the multiple encoding ranges to ensure appropriate encoding ranges are stored in the TCAM module.

Figure 6A:
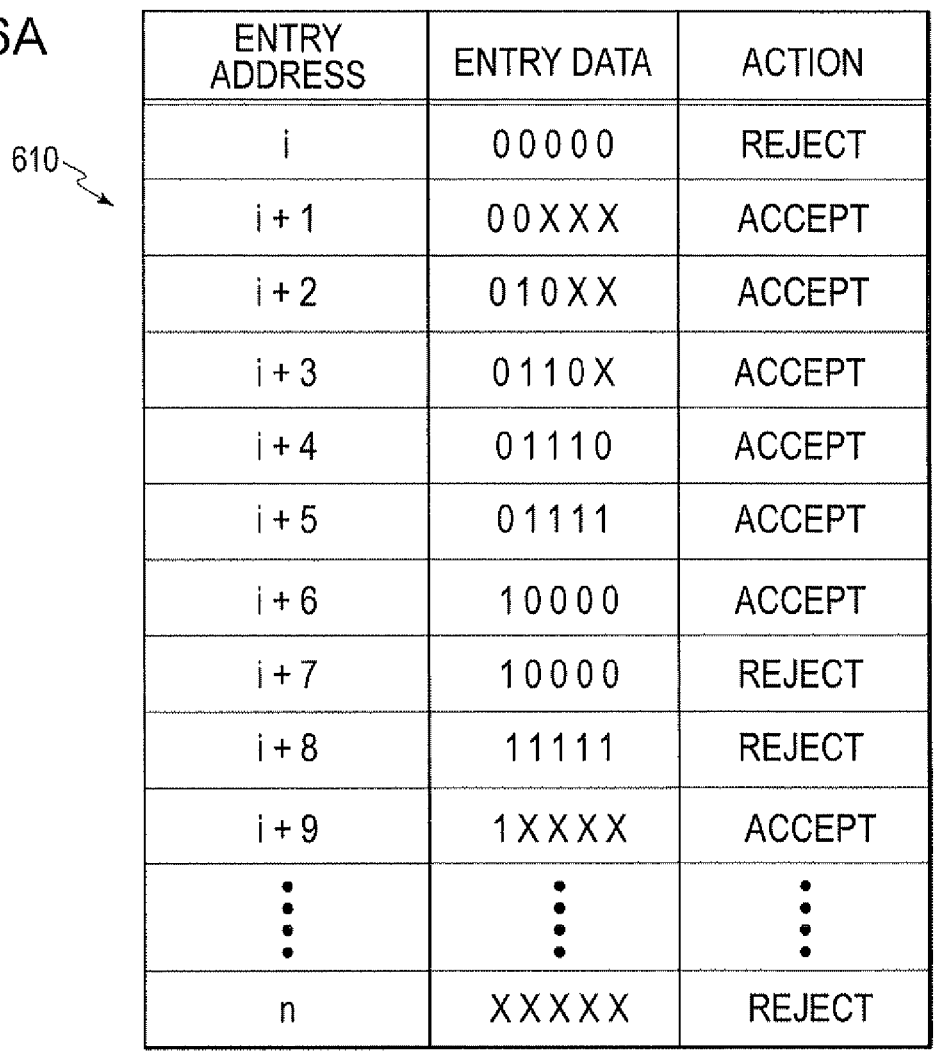
FIGS. 6A-6B show encoding table examples corresponding to the encoding examples in FIG. 5.

FIG. 6A shows an encoding table example 610 corresponding to the encoding example A in FIG. 5.

The encoding table 610 includes an entry address column, an entry data column, and an action column. The entry address column includes addresses of storage entries in a TCAM bank. The entry data column includes data to be stored in the storage entries. The action column includes actions to be associated with the addresses.

In the encoding table 610, storage entries i to i+4 are selected to encode the encoding range 511, storage entries i+5 and i+6 are selected to encode the encoding range 512, storage entries i+7 to i+9 are selected to encode the encoding range 513.

It is noted that the storage entry n having the lowest priority stores all mask bits, and is also in association with reject action. It is noted that storage entry selections can be changed without affecting the stored ranges and the search functions.

Figure 6B:
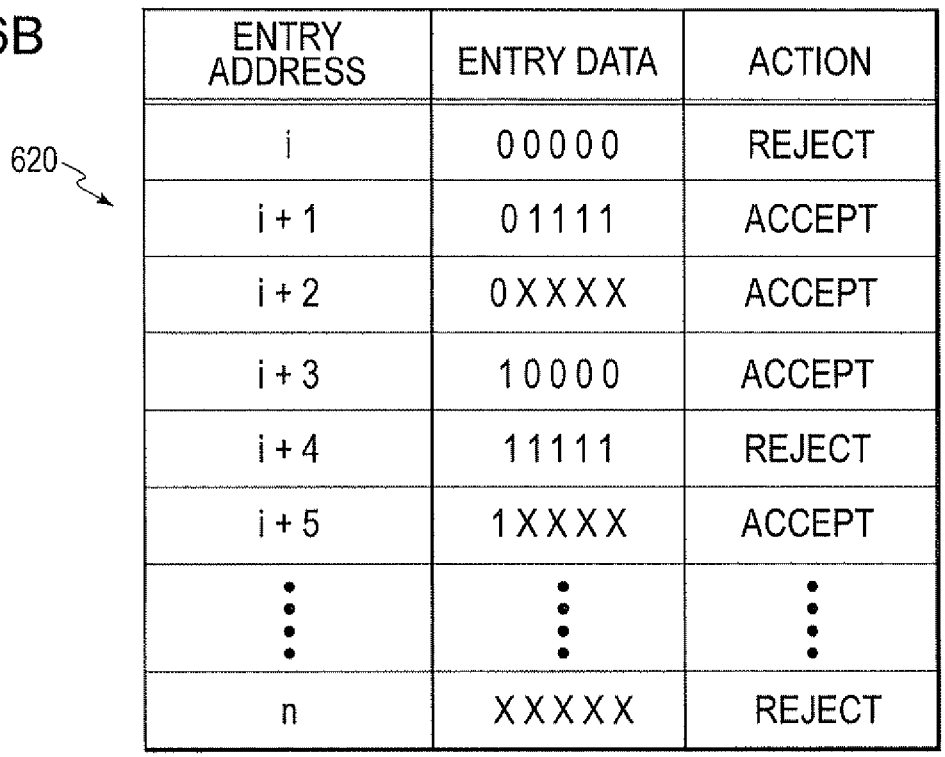

FIG. 6B shows an encoding table example 620 corresponding to the encoding example B in FIG. 5.

The encoding table 620 includes an entry address column, an entry data column, and an action column. The entry address column includes addresses of storage entries in a TCAM bank. The entry data column includes data to be stored in the storage entries. The action column includes actions to be associated with the addresses.

In the encoding table 620, storage entries i+1 and i+3 are selected to encode the encoding range 512, storage entries i to i+2 are used to encode the encoding range 511, storage entries i+3 to i+5 are selected to encode the encoding range 513.

It is noted that the storage entry n having the lowest priority stores all mask bits, and is also in association with reject action. It is noted that storage entry selections can be changed without affecting the stored ranges and the search function.

Figure 7:
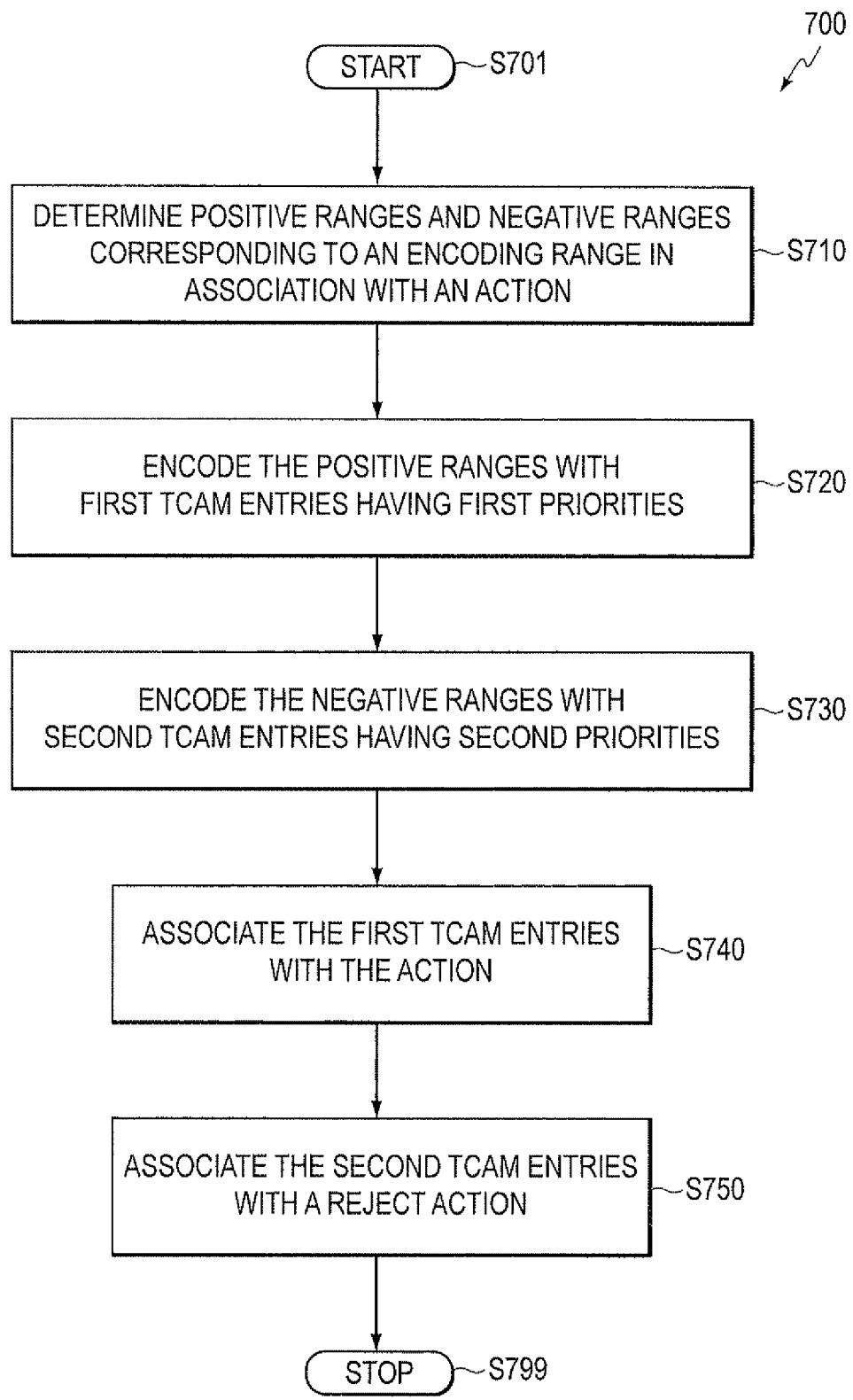
FIG. 7 shows a flow chart outlining a process example for encoding a range in TCAM according to an embodiment of the disclosure.

FIG. 7 shows a flow chart outlining a process example for a TCAM encoder to encode an encoding range using overlapping encoding according to an embodiment of the disclosure. The encoding range is in association with an action.

In an embodiment, the TCAM encoder includes a plurality of encoding techniques, such as pre-fix encoding, overlapping encoding, and the like. The TCAM encoder first determines a number of storage entries needed for each encoding technique to encode the encoding range, and then selects the encoding technique that needs the smallest number of storage entries. When the overlapping encoding needs the smallest number of storage entries, the process starts at S701, and proceeds to S710.

At S710, the TCAM encoder determines positive ranges and negative ranges to encode the encoding range using the overlapping encoding. The positive ranges include the encoding range. The negative ranges exclude the encoding range. In an embodiment, each of the positive ranges and the negative ranges is encoded by a single TCAM storage entry. Each of the positive ranges and the negative ranges can be encoded using a single TCAM storage entry. At least a positive range and a negative range are overlapping. In an example, the negative range is the overlapping portion.

At S720, the TCAM encoder encodes the positive ranges with first TCAM storage entries having first priorities. In an example, the TCAM encoder selects the first TCAM entries to encode the positive ranges. In another example, the TCAM encoder generates an encoding table to assign addresses of the first TCAM entries to the positive ranges.

At S730, the TCAM encoder encodes the negative ranges with second TCAM storage entries having second priorities. In an example, the TCAM encoder selects the second TCAM entries to encode the negative ranges. In another example, the TCAM encoder assigns addresses of the second TCAM entries to encode the negative ranges in the encoding table.

According to an embodiment of the disclosure, the negative ranges are encoded with relatively higher priorities than their corresponding overlapping positive ranges. For example, when a negative range and a positive range overlaps, the negative range is assigned to a lower address, in other words a higher priority, than the positive range. The TCAM encoder can suitably adjust the storage entry selections for the positive and negative ranges to satisfy this priority limitation. During a search operation, for example, when a search key falls in both the positive range and the negative range, the storage entry storing the negative range is prioritized to be the matching entry due to its higher priority.

At S740, the TCAM encoder associates the action of the encoding range with the first TCAM storage entries. In the encoding table example, the TCAM encoder associates addresses of the first TCAM storage entries with a pointer to action codes of the action.

At S750, the TCAM encoder associates a reject action with the second TCAM entries. In the encoding table example, the TCAM encoder associates addresses of the second TCAM storage entries with a pointer to the reject action. In an example, the reject action means a different action from the action in association with the encoding range. In another example, the reject action is a default rejection. It is noted that there can be more than one reject actions. The process then proceeds to S799 and terminates.

It is noted that the process 700 can be suitably adjusted. In an example, S720 and S730 can be combined. In another example, the sequence of S720 and S730 can be swapped. In the encoding table example, the TCAM encoder first determines the encoding table, and then configures a TCAM module according to the encoding table.

FIGS. 8A-D show a code example for generating an encoding table for an encoding range in association with an action.

While the invention has been described in conjunction with the specific embodiments thereof that are proposed as examples, it is evident that many alternatives, modifications, and variations will be apparent to those skilled in the art. Accordingly, embodiments of the invention as set forth herein are intended to be illustrative, not limiting. There are changes that can be made without departing from the scope of the invention.

What is claimed is:

1. A method for encoding ranges in a ternary content addressable memory (TCAM), comprising:
    determining first positive ranges and first negative ranges corresponding to a first encoding range to be encoded in the TCAM, the first encoding range being associated with a first action, the first positive ranges including the first encoding range, the first negative ranges excluding the first encoding range, at least a first positive range and a first negative range being overlapping;
    encoding the first positive ranges in first TCAM entries;
    encoding the first negative ranges in second TCAM entries, at least one of the second TCAM entries having a higher priority than one of the first TCAM entries;
    associating the first TCAM entries to the first action; and
    associating the second TCAM entries to a reject action.

2. The method of claim 1, wherein determining the first positive ranges and the first negative ranges corresponding to the first encoding range to be encoded in the TCAM, further comprises at least one of:
    determining the first positive ranges and the first negative ranges that overlap below a first boundary of the first encoding range, the first boundary is lower than a second boundary of the first encoding range; and
    determining the first positive ranges and the first negative ranges that overlap above the second boundary of the first encoding range.

3. The method of claim 1, further comprising:
    determining that a first number of the first TCAM entries and the second TCAM entries is smaller than a second number of TCAM entries using a non-overlapping encoding to encode the first encoding range.

4. The method of claim 1, further comprising:
    encoding a second encoding range in the TCAM, the second encoding range being associated with a second action.

5. The method of claim 4, further comprising:
    determining the first negative ranges that do not overlap with the second encoding range when the second encoding range is higher than the first encoding range.

6. The method of claim 4, further comprising:
    determining an entry of the second TCAM entries storing a negative range that overlaps with the second encoding range; and
    re-associating the entry with the second action.

7. The method of claim 4, further comprising:
    encoding the second encoding range using a non-overlapping encoding.

8. A ternary content addressable memory (TCAM), comprising:
    first TCAM entries for encoding a first encoding range in association with a first action, the first TCAM entries including:
        a first plurality of TCAM entries associated with the first action, the first plurality of TCAM entries storing first positive ranges, the first positive ranges including the first encoding range; and
        a second plurality of TCAM entries associated with a reject action, the second plurality of TCAM entries storing first negative ranges, the first negative ranges excluding the first encoding range, at least a first negative range overlapping a first positive range, at least one of the second plurality of TCAM entries having a higher priority than one of the first plurality of TCAM entries.

9. The TCAM of claim 8, wherein the first positive ranges and the first negative ranges overlap below a first boundary of the first encoding range and/or above a second boundary of the first encoding range, the first boundary is lower than the second boundary of the first encoding range.

10. The TCAM of claim 8, wherein a first number of the first TCAM entries and the second TCAM entries is smaller than a second number of TCAM entries using a non-overlapping encoding to encode the first encoding range.

11. The TCAM of claim 8, further comprising:
    second TCAM entries for encoding a second encoding range in the TCAM, the second encoding range being associated with a second action.

12. The TCAM of claim 11, wherein the second encoding range is lower than the first encoding range.

13. The TCAM of claim 11, wherein the second encoding range is higher than the first encoding range, and the first negative ranges do not overlap with the second encoding range.

14. The TCAM of claim 11, wherein a first negative range is within the second encoding range, an entry storing the first negative range is in association with the second action.

15. A network switch including the TCAM of claim 8, wherein the first encoding range corresponds to a range condition of a switching rule, and the first action corresponds to a switch decision of the switching rule.

16. A non-transitory computer readable medium storing program instructions for causing a processor to execute operations for encoding ranges in a ternary content addressable memory (TCAM), the operations comprising:
    determining first positive ranges and first negative ranges corresponding to a first encoding range to be encoded in the TCAM, the first encoding range being associated with a first action, the first positive ranges including the first encoding range, the first negative ranges excluding the first encoding range, at least a first positive range and a first negative range being overlapping;
    encoding the first positive ranges in first TCAM entries;
    encoding the first negative ranges in second TCAM entries, at least one of the second TCAM entries having a higher priority than one of the first TCAM entries;
    associating the first TCAM entries to the first action; and
    associating the second TCAM entries to a reject action.

17. The non-transitory computer readable medium of claim 16, wherein determining the first positive ranges and the first negative ranges corresponding to the first encoding range to be encoded in the TCAM, further comprises at least one of:

determining the first positive ranges and the first negative ranges that overlap below a first boundary of the first encoding range, the first boundary is lower than a second boundary of the first encoding range; and determining the first positive ranges and the first negative ranges that overlap above the second boundary of the first encoding range.

18. The non-transitory computer readable medium of claim 16, the operations further comprising:

determining that a first number of the first TCAM entries and the second TCAM entries is smaller than a second number of TCAM entries using a non-overlapping encoding to encode the first encoding range.

19. The non-transitory computer readable medium of claim 16, the operations further comprising:

encoding a second encoding range in the TCAM, the second encoding range being associated with a second action.

20. The non-transitory computer readable medium of claim 19, the operations further comprising:

determining an entry of the second TCAM entries storing a first negative range that overlaps with the second encoding range; and re-associating the entry with the second action.

* * * * *